Jan. 1, 1957 M. W. SLATE 2,776,376

MULTIPLE BAND TUNING DEVICE

Filed Dec. 22, 1952 2 Sheets-Sheet 1

INVENTOR.
MATTHEW W. SLATE
BY
Darby + Darby
ATTORNEYS

INVENTOR.
MATTHEW W. SLATE
BY Darby & Darby
ATTORNEYS 2,776,376

MULTIPLE BAND TUNING DEVICE

Matthew W. Slate, New York, N. Y., assignor to Allen B. Du Mont Laboratories, Inc., Clifton, N. J., a corporation of Delaware Application December 22, 1952, Serial No. 327,242

2 Claims. (Cl. 250—40)

This invention relates to electrically tuned circuits wherein different coils are selectively tuned over different frequency ranges by means of variable condensers.

In tuned circuits of the prior art, it has been common practice to selectively switch different coils to be electrically connected to a single variable condenser in order that the condenser may tune the different coils over differing frequency ranges. Such an arrangement, however, is found not suitable where widely differing ranges of frequencies are to be tuned. Such an arrangement is not suitable, since low frequencies require a relatively large value of tuning condenser capacitance and variation thereof in order to tune over a desired range of frequencies, whereas higher frequencies require a relatively small value of capacitance and variation thereof, which must also be capable of adjustment to a small value of minimum capacitance. Thus, a single tuning condenser is unsuitable where widely differing ranges of frequencies are to be tuned. In the prior art, the problem has frequently been solved by providing an individual tuning condenser for use with each coil. This, of course, entails extra expense and sometimes unwieldy and bulky arrangements of components.

The present invention solves the problem by providing a single condenser unit having two or more stator sections arranged to cooperate with a single rotor section, the stator sections being selectively used in cooperation with different tuning coils.

An object of the invention is to provide a multi-band tuner which is efficient and physically compact, and which is suitable for tuning the V. H. F. and U. H. F. television frequencies.

Another object is to provide a tuning condenser having two or more stator sections which selectively function in combination with a single rotor section, and to provide such a tuning condenser in which both stator sections tune with the same or a predetermined characteristic or ratio of capacitance variation.

Other objects and features of the invention will be apparent when the following description is considered together with the annexed drawings, in which, Figure 1 is a front elevational view of a preferred embodiment of the novel tuning condenser in accordance with the present invention;

Figure 1:
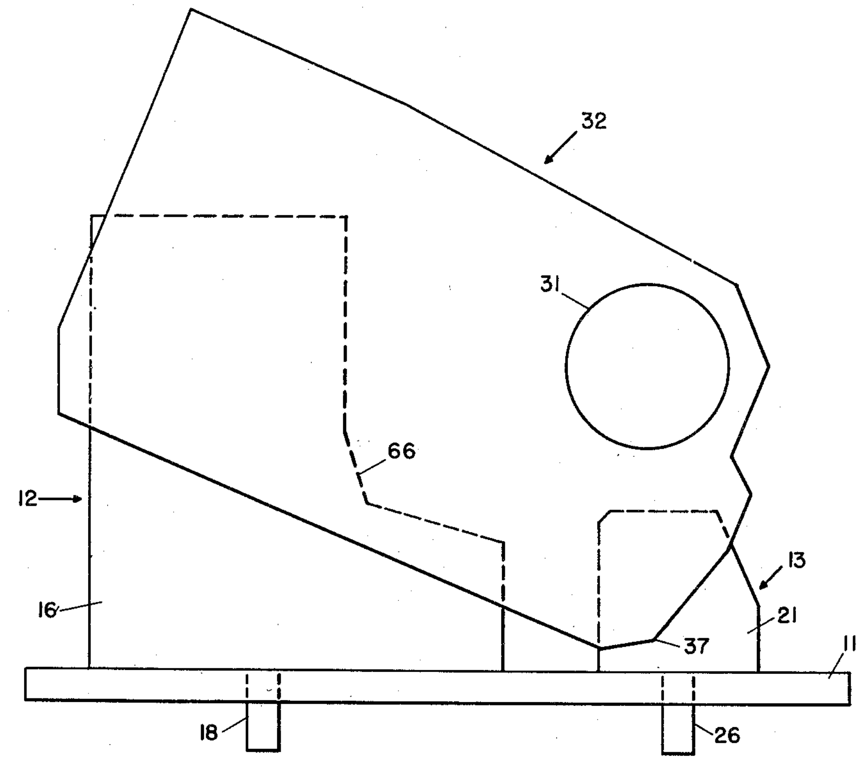
Figure 2:
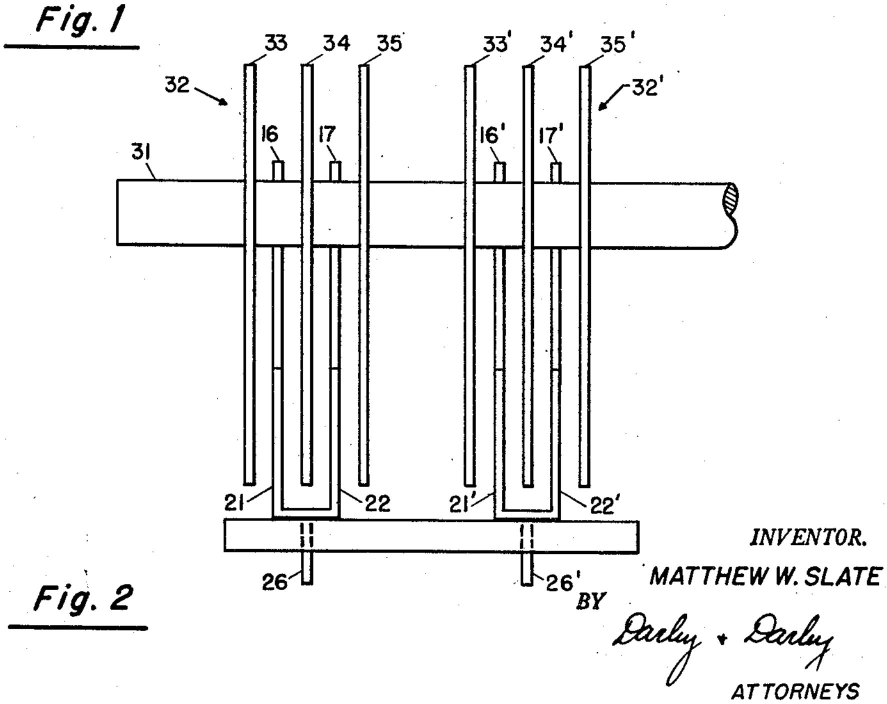
Figure 2 is a side elevational view of the device of Figure 1 looking towards the right hand side thereof.

The novel tuning condenser, in its preferred embodiment, is of the type known in the art as a split-stator condenser, and comprises an insulative base 11 having attached thereto a large-capacitance stator section 12 and a low-capacitance stator section 13. The large-capacitance stator section 12 comprises one or more flat conductive plates 16, 17 arranged in parallel alignment and connected to an electrical terminal 18. The small-capacitance stator section 13 comprises one or more flat conductive plates 21, 22 arranged in parallel alignment with respect to each other and with respect to the large-capacitance stator section 12; i. e., the plates 21, 22 are positioned in the same planes as the respective large-capacitance stator plates 16, 17. Although the drawing shows the preferred embodiment as having the same number of plates in the low-capacitance stator section as in the large-capacitance stator section, this is not mandatory, i. e., the number of plates in the low capacitance stator section may be more or less than the number of plates in the large-capacitance stator section.

Figure 4:
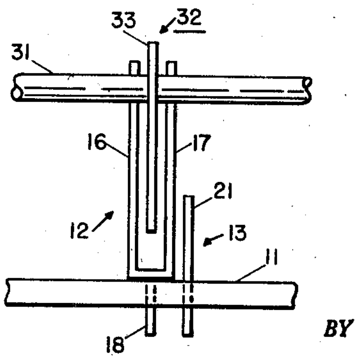
Figure 4 is a side view of an alternative embodiment of the invention.

All of the plates 21, 22 of the low capacitance stator section 13 are connected to a common electrical terminal 26. The large-capacitance plates may be physically larger than the low-capacitance plates, or may be positioned closer to the plane of the rotor plates, or there may be more of them, as shown in Figure 4, in order to achieve a larger capacitance. To provide closer spacing, the stator plates may be made from thicker material.

In the preferred split-stator embodiment as shown, a second set of large-capacitance stator plates comprising electrically conductive plates 16′ and 17′ and also comprising a section of low-capacitance stator plates 21′ and 22′, are positioned on the base 11 in axial alignment with the first mentioned stator sections 12 and 13.

A rotatable shaft 31 of electrically conductive material is positioned in a parallel relationship with respect to the base 11. A rotor section 32, comprising electrically conductive rotor plates 33, 34 and 35, is positioned on the shaft 31 so that the rotor plates will enmesh with but not touch the stator plates 16, 17 and 21, 22 simultaneously or in a predetermined manner when the shaft 31 is rotated. A second rotor section 32′, comprising electrically conductive plates 33′, 34′ and 35′ is positioned on the shaft 31 in a like relationship with respect to the second set of stator plates 12′ and 13′. The rotor sections 32 and 32′ rotate in unison when the shaft 31 is rotated.

The particular shapes of the stator plates and of the rotor plates are preferably as shown in the drawing, or equivalent, in order to achieve a desired tracking or characteristic of capacitance variation, as will be described. A shoulder 66 is shown provided in the plates of the large-capacitance stator section 12, so that the lower corner 37 of the rotor 32 will be unmeshed from the large-capacitance section 12 when the rotor 32 is rotated to its "raised" or minimum capacitance position. Thus, the minimum capacitance obtainable between the rotor 32 and the stator sections 12 and 13 will occur at the same angular position of the shaft 31.

As shown, the low-capacitance section 13 is positioned relatively near to or under the shaft 31, whereas the large-capacitance section 12 is positioned relatively far from the shaft 31. This arrangement provides improved results, since the rotor section 32 has a relatively greater linear movement at a greater disance from the shaft 31 where the large-capacitance stator section 12 is positioned, and has relatively less linear movement at a shorter distance from the shaft 31 where the small-capacitance stator section 13 is positioned.

Figure 3:
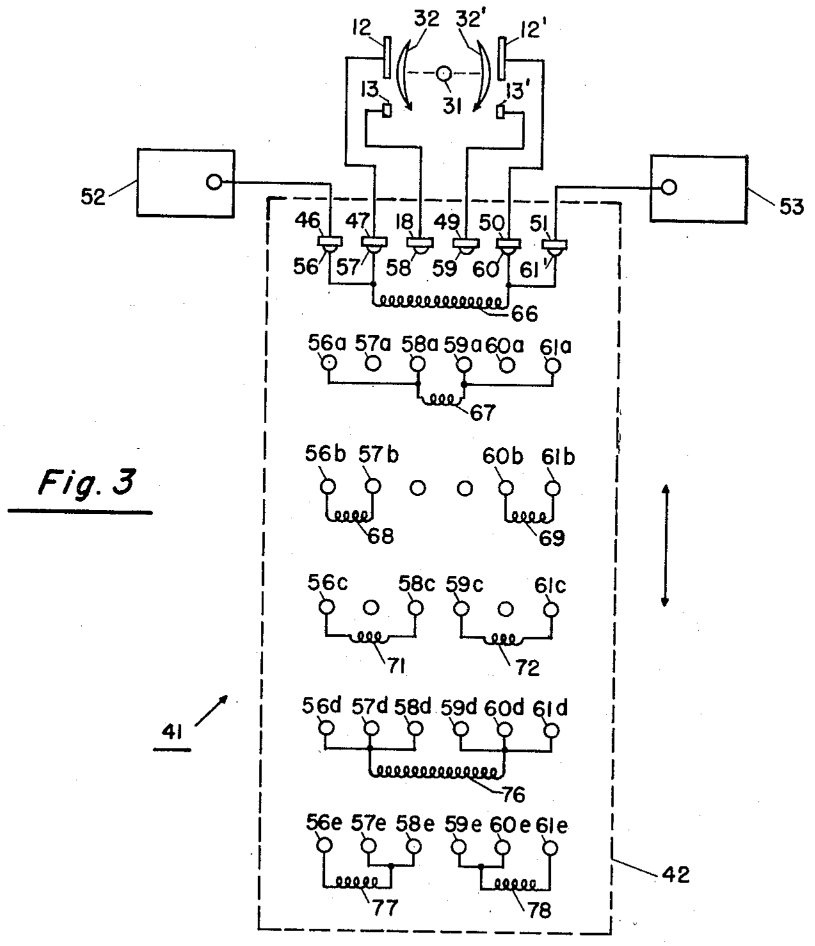
Figure 3 is an electrical diagram showing the novel tuning condenser connected to selectively cooperate with differing tuning coils or inductances.

Now referring to the electrical circuit of Figure 3, there is shown, in addition to the novel split-stator embodiment of the invention, a sliding switch mechanism 41 comprising an insulative member 42 having attached thereto sets of electrical contacts. Fixed contacts 46—51 are provided to selectively engage contacts on the slider mechanism 41 when the latter is moved. The fixed contacts 46 and 51 are shown connected to electrical circuits 52, 53, which may be oscillators, amplifiers, mixers, or the like. A pair of fixed contacts 47, 50 are connected to the large-capacitance stator sections 12 and 12', and another pair of fixed contacts 48, 49 are connected to the small-capacitance stator sections 13 and 13'.

Each set of contacts on the sliding mechanism 41 comprises a plurality of contacts 56—61 arranged to simultaneously engage the respective fixed contacts 46—51. By way of example, several sets of coils or inductances are represented on the sliding mechanism 41. A low frequency coil 66 is shown connected at one end to contacts 56 and 57, and at the other end to contacts 60 and 61. This arrangement connects the coil 66 in shunt with the large-capacitance stator sections 12 and 12' and also to the electrical circuits 52, 53, when the mechanism 41 is in one of its selective positions. Another tuning section comprises a high frequency coil 67 connected at the ends thereof to the contacts 56*a*, 58*a*, and 59*a*, 61*a*. Thus, when the mechanism 41 is properly moved, the coil 67 will become connected in shunt to the small-capacitance stator sections 13, 13' and to the electrical circuits 52, 53.

Another tuned section comprises a pair of low-frequency coils 68, 69 respectively connected between the contacts 56*b*, 57*b* and 60*b*, 61*b*. Thus, these coils 68, 69 may be selectively connected in series wtih the circuits 52, 53 and the large-capacitance stator sections 12, 12'. Similarly, a pair of high-frequency coils 71, 72 may be respectively connected between contacts 56*c*, 58*c* and 59*c*, 61*c*, in order to selectively connect these coils in series with the small-capacitance stator sections 13, 13'.

To achieve an increased capacitance effect, the contacts can be connected so that the low-capacitance stator sections 13, 13' will be connected in electrical parallel with the large-capacitance stator sections 12, 12'. As shown, a coil 76 may be thus shunt-connected by having an end thereof connected to the contacts 56*d*, 57*d* and 58*d*, the other end being connected to the contacts 59*d*, 60*d*, and 61*d*. Also, a pair of coils 77, 78 may be selectively series-connected through both stator sections, if one coil 77 is connected between contacts 56*e* and 57*e*, 58*e* and the coil 78 is connected between the contacts 61*e* and 59*e*, 60*e*.

It will be understood that when tuning ranges are changed, by switching or sliding the support 42 so as to engage different coils in the tuned circuit, the proper stator elements automatically become connected into the circuit, i. e., the large capacitance stator sections are automatically employed in cooperation with the large inductance coils whereas the small capacitance stator sections are automatically connected in cooperation with the low-inductance coils.

From the foregoing, it will be appreciated that the novel tuning circuit accomplishes efficient electrical operation over a wide range of tuning frequencies in cooperation with different inductance coils having widely differing values of inductance. The novel system achieves increased tuning range over each of the differing coil ranges by virtue of providing a tuning condenser having a low minimum capacitance value in cooperation with the small inductance coils and by providing a larger capacitance condenser in coperation with the larger inductance coils. If a larger capacitance condenser were attempted to be used in cooperation with a small inductance coil, even the minimum capacity of such a condenser would be too great for proper operation of the coil, and the electrical efficiency and "Q" would be low.

In addition to the advantages above described which are afforded by the invention, the stator sections 12 and 13 may be so shaped and arranged and the rotor section 32 may be so shaped and arranged that the tracking or characteristic of capacitance or frequency variation, will be the same for different values of inductance coils used in the circuit. This permits a tuning dial, for instance, to be calibrated in several scales which are essentially linear.

While a preferred embodiment of the invention has been shown in the form of a split-stator tuning condenser, it will be appreciated by those skilled in the art that single section condensers may be likewise employed, and that other modifications of the invention may be made without departing from the spirit and scope thereof. The scope of the invention is defined in the following claims.

What is claimed is:

1. A multiple-band tuning device comprising a tuning condenser having a rotor section rotatable about an axis and a plurality of stator sections positioned substantially in a common plane near the path of said rotor section, said stator sections being positioned at respectively different distances from said axis whereby the capacitances between said rotor section and the respective stator sections will vary simultaneously, one of said stator sections being shaped and positioned to provide a larger capacitance than another of said stator sections, a plurality of inductance members having differing inductance values, and means for selectively switching the larger-value ones of said inductance members to said larger-capacitance stator section and the smaller-values ones of said inductances to said lower-capacitance stator sections.

2. The device in accordance with claim 1, in which said switching means comprises a movable switch plate having a row of contactors to which said larger-value inductances are respectively connected, another row of contactors parallel to said first row to which said lower-value inductances are respectively connected, a fixed contactor electrically connected to said larger-capacitance stator section and positioned to selectively engage said row of movable contactors to which said larger-value inductances are connected, and another fixed contactor electrically connected to said smaller-capacitance stator section and positioned to selectively engage said row of movable contactors to which said lower-value inductances are connected.

References Cited in the file of this patent

UNITED STATES PATENTS

| | | |
|---|---|---|
| 1,672,367 | Cardwell | June 5, 1928 |
| 1,904,165 | Mullner | Apr. 18, 1933 |
| 2,169,257 | Krebs et al. | Aug. 15, 1939 |
| 2,223,061 | Ducati | Nov. 26, 1940 |
| 2,295,173 | Hoffman et al. | Sept. 8, 1942 |
| 2,344,689 | Frazier | Mar. 21, 1944 |
| 2,443,935 | Shea | June 22, 1948 |
| 2,557,969 | Isley | June 26, 1951 |

FOREIGN PATENTS

| | | |
|---|---|---|
| 464,254 | Great Britain | Apr. 14, 1937 |
| 591,258 | Great Britain | Aug. 12, 1947 |